(12) United States Patent
Cohen

(10) Patent No.: US 7,715,237 B2
(45) Date of Patent: May 11, 2010

(54) METHOD, SYSTEM AND CIRCUIT FOR OPERATING A NON-VOLATILE MEMORY ARRAY

(75) Inventor: Guy Cohen, Yaad (IL)

(73) Assignee: Saifun Semiconductors Ltd., Netanya (IL)

( * ) Notice: Subject to any disclaimer, the term of this patent is extended or adjusted under 35 U.S.C. 154(b) by 0 days.

(21) Appl. No.: 12/071,749

(22) Filed: Feb. 26, 2008

(65) Prior Publication Data

US 2008/0180999 A1    Jul. 31, 2008

Related U.S. Application Data

(63) Continuation of application No. 11/324,718, filed on Jan. 3, 2006, now Pat. No. 7,352,627.

(51) Int. Cl.
G11C 16/04 (2006.01)
(52) U.S. Cl. .............................. 365/185.2; 365/185.03; 365/210
(58) Field of Classification Search .............. 365/185.2, 365/185.03, 201, 210, 189.09
See application file for complete search history.

(56) References Cited

U.S. PATENT DOCUMENTS

| | | | |
|---|---|---|---|
| 6,788,575 B2 * | 9/2004 | Kozakai et al. | 365/185.09 |
| 7,012,845 B2 * | 3/2006 | Kozakai et al. | 365/200 |
| 7,366,034 B2 * | 4/2008 | Kozakai et al. | 365/189.05 |
| 2004/0057316 A1 * | 3/2004 | Kozakai et al. | 365/222 |
| 2007/0153575 A1 | 7/2007 | Cohen | |

* cited by examiner

Primary Examiner—Gene N. Auduong
(74) Attorney, Agent, or Firm—Eitan Mehulal Law Group

(57) ABSTRACT

As part of the present invention, a memory cell may be operated using reference cells having a threshold offset circuit. According to some embodiments of the present invention, a threshold offset value may be determined for a memory cell to be operated based on a location (e.g. memory segment within a memory array) of the memory cell. An input offset circuit of a global reference cell may be adjusted by the threshold offset value for the memory cell; and the memory cell may be operated (e.g. read, written or erased) using the global reference cell whose input offset circuit has been adjusted by the threshold offset value. According to some embodiments of the present invention global reference cells may consist of multiple sets of reference cells, wherein, according to some aspects, each set of the multiple sets of reference cells may be used for operating a different memory array segment. According to other aspects, each set of the multiple sets of reference cells may be used for operating a different state of memory array cells.

16 Claims, 7 Drawing Sheets

METHOD, SYSTEM AND CIRCUIT FOR OPERATING A NON-VOLATILE MEMORY ARRAY

CROSS-REFERENCE TO RELATED APPLICATIONS

This application is a continuation application of U.S. patent application Ser. No. 11/324,718, filed Jan. 3, 2006, now U.S. Pat. No. 7,352,627 which is hereby incorporated by reference in its entirety.

FIELD OF THE DISCLOSURE

The present disclosure relates generally to the field of semiconductors. More particularly, the present disclosure relates to a system and method of operating one or more (e.g. an array) of nonvolatile memory ("NVM") cells.

BACKGROUND

As is well known in the art, non-volatile memory (NVM) cells may have bits stored therein that may be read, such as by means of a sense amplifier. In general, the sense amplifier determines the logical value stored in the cell by comparing the output of the cell with a reference level. If the current output is above the reference, the cell is considered erased (with a logical value of 1) and if the current output is below the reference, the cell is considered programmed (with a logical value of 0). In terms of threshold voltage of the cell itself, programming a cell increases the threshold voltage of the cell, whereas erasing decreases the threshold voltage.

Different current levels are associated with different logical states, and a NVM cell's current level may be correlated to the amount of charge stored in a charge storage region of the cell. The cell prior to the storing of any charge within a charge storage region may be referred to as "native" or in its "initial" state.

Generally, in order to determine whether an NVM cell is at a specific state, for example erased, programmed, or programmed at one of multiple possible program states within a multi-level cell ("MLC"), the cell's current level is compared to that of a reference cell whose current level is preset at a level associated with the specific state being tested for.

In the simplest case, a "program verify" reference cell with a current set at level defined as a "program verify" level may be compared to a cell being programmed (i.e. charged) in order to determine whether a charge storage area of the cell has been sufficiently charged so as to be considered "programmed."

In the case where the cell is an MLC, the cell may have several possible program states, and one or more program reference cells, each with one or more different current levels corresponding to each of the NVM cell's possible program states, may be used to determine the state of the MLC.

For reading a cell, the current levels of one or more "read verify" reference cells may be compared to the current of the cell being read. An "erase verify" reference cell with a current set at a level defined as an "erase verify" level may be compared against a memory cell during an erase operation in order to determine when the memory cell's charge storage area has been sufficiently discharged so as to consider the cell erased. Enough margins should be kept between the different reference levels so that the logical state interpretation is free of mistakes under the different operation conditions (e.g. temperature and voltages changes and retention of the stored charge). In the simplest case it is common to define the margin between the read level and the erase verify level as the "erase margin" and the margin between the read level and the program verify level as the "program margin". The margin between the initial NVM cell level and the lowest reference level, usually the erase verify level, is referred to as 'cycle margin' ("CM"). Other margins and levels may be defined for different purposes. In a MLC NVM, few margins and levels are defined to assure a correct operation and interpretation of the different levels.

The positioning of the different reference levels is accomplished using data extracted from the NVM array during manufacturing. That is, during the manufacturing process, after fabrication, an NVM array may be tested to determine the native current levels of each of its cells. The presetting of the reference level is made using this data.

As FIG. 1 shows, native threshold voltages, and hence native currents, distribution across an NVM array may be different in different segments of the NVM array. Native threshold voltage distributions on an array may be in the order of 0.7V or more across the array. However, the distributions across an array segment may be lower, for example 0.2V. Thus, establishing the lowest reference voltage to be slightly higher than the highest native threshold voltage of the array (e.g., native threshold voltage found in a NVM cell in segment 1D of FIG. 1) may result in a large CM for cells in array segments whose NVM cells have native threshold voltages relatively lower than those in the segment with the NVM cell having the highest native threshold voltage.

SUMMARY

The following embodiments and aspects thereof are described and illustrated in conjunction with systems, tools and methods, which are meant to be exemplary and illustrative, not limiting in scope. In various embodiments, one or more of the above-described problems have been reduced or eliminated, while other embodiments are directed to other advantageous or improvements.

The present invention is a system, method and circuit for operating an array of memory cells. According to some embodiments of the present invention, NVM cells of an array may be tested to determine a native threshold voltage distribution across the array and, if so desired or required, across array segments. A lowest reference voltage level for each array segment may be determined, where the lowest reference voltage level may be used to test or verify the logical state of the NVM cells associated with the lowest threshold voltage (e.g. erase state). The lowest reference voltage for each segment may be determined to be equal to or greater or lower than the highest native threshold voltage of any cell within the given array segment.

As part of the present invention, the lowest reference voltage determined for each segment may be stored in a reference voltage table associated with the NVM array. According to some embodiments of the present invention, other segment-specific reference voltage levels may be stored in a "reference voltage table", such that the table may contain entries with values correlated to, or associated with, reference voltage levels associated with each array segment. The reference voltage levels correlated to, or associated with, a given array segment may be, for example, program verify voltage level for that segment, read verify voltage level for that segment, etc. That is, the table may contain one or more entries for each one of a plurality of array segments, where the one or more entries per array segment may be correlated to one or more reference voltages for the given segment.

According to some embodiments of the present invention, an entry in a reference voltage table may indicate the absolute reference voltage associated with a specific logical state of a specific array segment (e.g. erase verify reference voltage for segment 1D=3.5V). In some other embodiments of the present invention, an entry in the table may indicate an offset value between a global reference voltage and a local reference voltage associated with a specific logical state of a specific array segment. For example, if a global erase verify reference voltage level is set to, or selected to be, 3.2V, but the erase verify reference voltage level (being the "local' reference voltage") for segment 1D has been determined to be 3.5V, the table entry associated with an erase verify reference voltage for segment 1D may indicate an offset voltage of 0.3V.

As part of the present invention, a NVM cell within an array of NVM cells may be operated using an entry in a reference voltage table associated with the array. When attempting to verify a logical state of a NVM cell in a specific array segment, a table entry associated with the given logical state, within the given array segment, may be read. The entry may be correlated to a reference voltage associated with the given logical state in the given array segment. The entry may either indicate a specific reference voltage associated with the given logical state within the given array segment, or the entry may indicate an offset value between a global reference voltage and a local reference voltage associated with the given logical state of in the given array segment. For example, if a global erase verify voltage level is set to 3.2V, but the erase verify voltage level for segment 1D has been determined to be 3.5V, the table entry associated with an erase verify reference voltage for segment 1D may indicate an offset voltage value of 0.3V.

According to some embodiments of the present invention, an electric circuit may provide an electric signal having a voltage, or current, level to operate either a NVM cell in an NVM array or to operate a reference cell associated with the array, or a segment thereof, wherein the provided voltage, or current, level may be correlated to an entry in the table. According to some embodiments of the present invention, the electric circuit may be an input offset circuit which may offset a voltage, or current, level of a signal provided by a charge pump or by other power supply circuit. In some embodiments of the present invention, the electric circuit may be part of a charge pump or part of another power supply circuit. The electric circuit may be used to either supply a signal to NVM cells in an NVM array or to reference cells associated with the NVM array or selected segments thereof.

According to some embodiments of the present invention, the global reference cells may include multiple sets of reference cells, wherein, according to some aspects, each set of the multiple sets of reference cells may be used for operating a different memory array segment. According to other aspects, each set of the multiple sets of reference cells may be used for operating a different state of memory array cells.

In addition to the exemplary aspects and embodiments described above, further aspects and embodiments will become apparent by reference to the figures and by study of the following detailed description.

BRIEF DESCRIPTION OF THE FIGURES

Exemplary embodiments are illustrated in referenced figures. It is intended that the embodiments and figures disclosed herein are to be considered illustrative rather than restrictive. Aspects of the present invention may best be understood by reference to the following detailed description when read with the accompanying figures, in which.

In the drawings, like numerals describe substantially similar components throughout the serial views.

DETAILED DESCRIPTION

Figure 1:
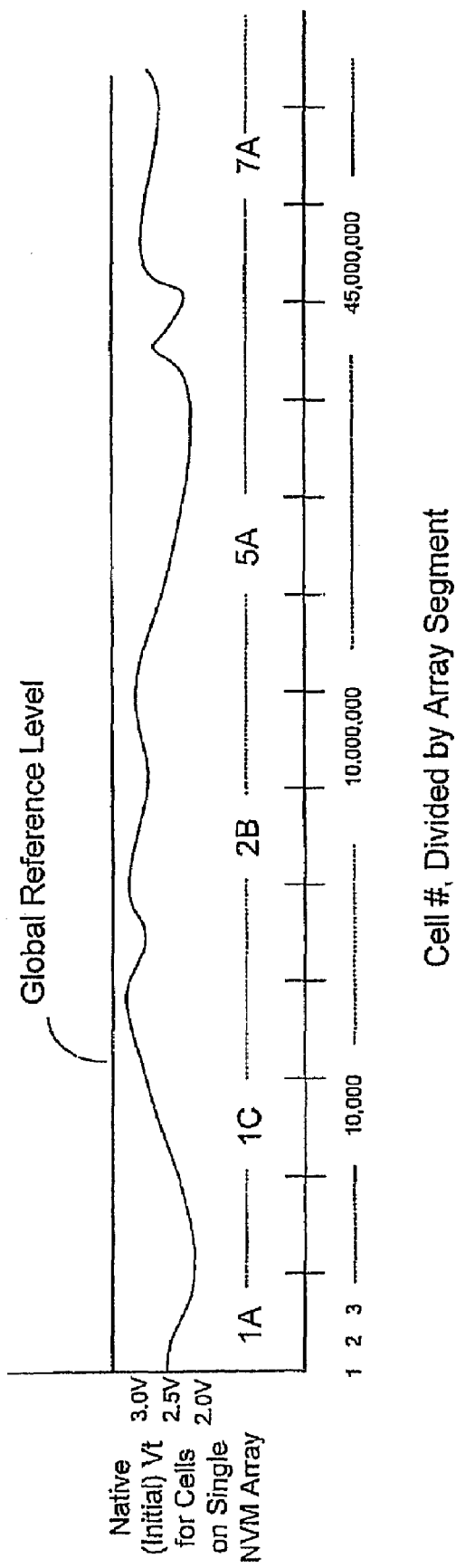
FIG. 1 is a graph showing an example of a possible native threshold voltage distribution between NVM cells in an NVM array, where the cells are numbered and grouped into array segments such that consecutively numbered cells are generally adjacent to one another and cells in the same array segments are generally in proximity with one another.

In the following detailed description, numerous specific details are set forth in order to provide a thorough understanding of the invention. However, it will be understood by those of ordinary skill in the art that the present invention may be practiced without these specific details. In other instances, well-known methods, procedures, and components have not been described in detail so as not to obscure the present invention.

The present invention is a system, method and circuit for operating an array of memory cells. According to some embodiments of the present invention, NVM cells of an array may be tested to determine a native threshold voltage distribution across the array and across array segments. A lowest reference voltage level for each array segment may be determined, where the lowest reference voltage level may be used to test or verify the logical state of the NVM cells associated with the lowest threshold voltage (e.g. erase state). The lowest reference voltage for each segment may be determined to be equal to or greater or lower than the highest native threshold voltage of any cell within the given array segment.

As part of the present invention, the lowest reference voltage determined for each segment may be stored in a reference voltage table associated with the NVM array. According to some embodiments of the present invention, other segment-specific reference voltage levels may be stored in a reference voltage table, such that the table may contain entries with values correlated to reference voltage levels associated with each array segment (e.g. program verify voltage level for the given segment, read verify voltage level for the segment, etc.). Additionally or alternatively, the reference voltage table may contain pointers to point at different sets of reference cells that were precharged during their manufacturing process to output different reference signals, whether currents or voltages. That is, the reference voltage table may contain one or more entries for each of a plurality of array segments, where the one or more entries per segment may be correlated to one or more reference voltages for the given segment.

In some embodiments of the present invention, an entry in a reference voltage table may indicate the absolute reference voltage associated with a specific logical state of a specific array segment (e.g. erase verify reference voltage for segment 1D=3.5V). In some other embodiments of the present invention, an entry in the table may indicate an offset value between a global reference voltage and a local reference voltage associated with a specific logical state of a specific array segment For example, if a global erase verify voltage level is set to 3.2V, but the erase verify reference voltage level for segment 1D has been determined to be 3.5V, the table entry associated with an erase verify reference voltage for segment 1D may indicate an offset voltage of 0.3V. In different embodiments the table may contain a pointer to a reference cell set.

As part of the present invention, a NVM cell within an array of a NVM cells may be operated using an entry in a reference voltage table associated with the array. When attempting to verify a logical state of a NVM cell in a specific array segment, a table entry associated with the given logical state, within the given array segment, may be read. The entry may be correlated to a reference voltage associated with the given logical state in the given array segment. The entry may either indicate a specific reference voltage associated with the given logical state within the array segment, or the entry may indicate an offset value between a global reference voltage and a local reference voltage associated with the given logical state in the given array segment. For example, if a global erase verify voltage level is set to 3.2V, but the erase verify voltage level for segment 1D has been determined to be 3.5V, the table entry associated with an erase verify reference voltage for segment 1D may indicate an offset voltage value of 0.3V.

According to some embodiments of the present invention, an electric circuit may provide an electric signal having a voltage level to operate either a NVM cell in an NVM array or to operate a reference cell associated with the array, wherein the provided voltage level may be correlated to an entry in the table. According to some embodiments of the present invention, the electric circuit may be an input offset circuit which may offset a voltage level of a signal provided by a charge pump or by another power supply circuit. In some embodiments of the present invention, the electric circuit may be part of a charge pump or part of another power supply circuit. The electric circuit may be used to either supply a signal to NVM cells in a NVM array or to reference cells associated with the NVM array.

Figure 2:
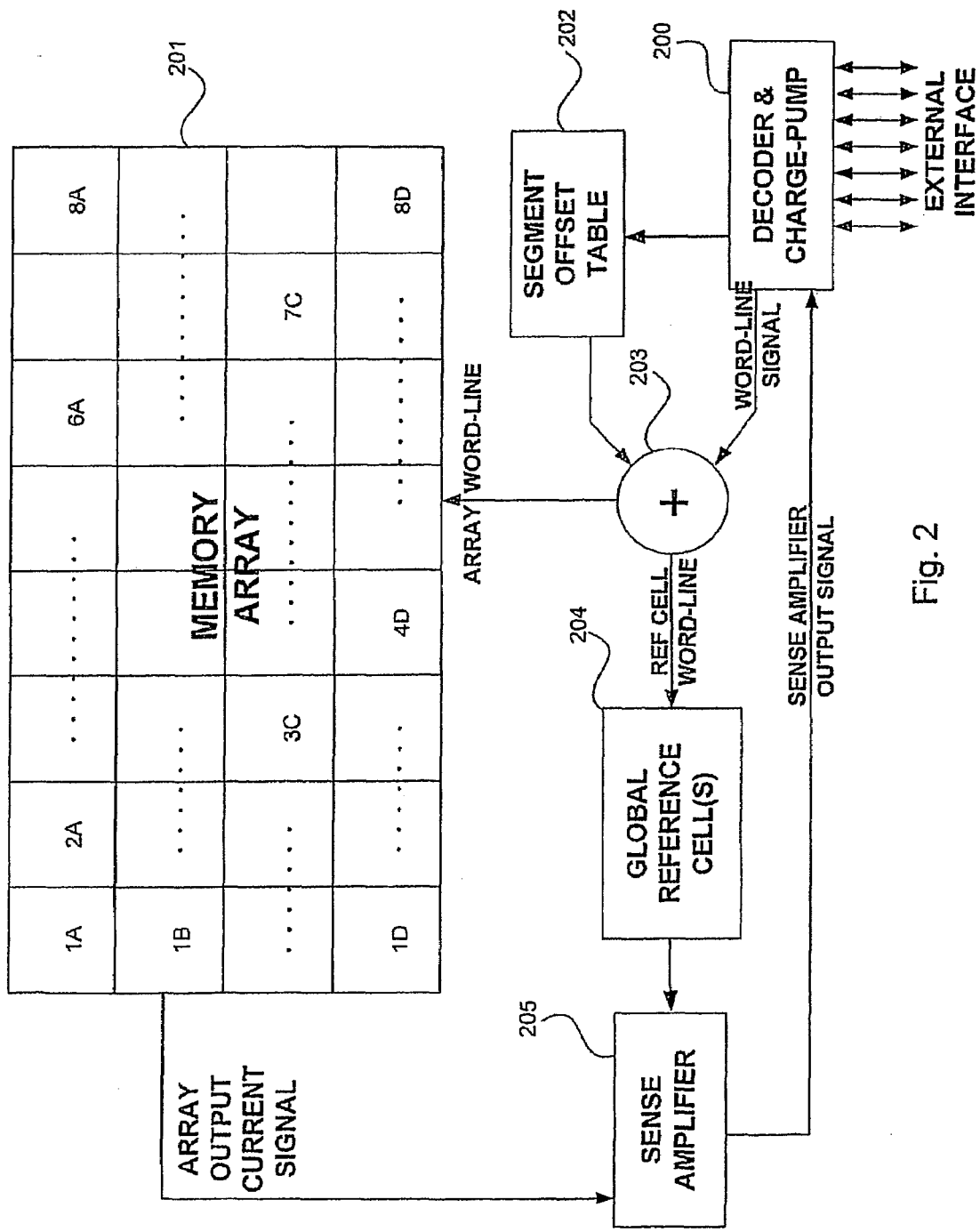
FIG. 2 is a block diagram illustration of an exemplary circuit for operating a NVM array, where an offset voltage/current is applied both to the NVM array cells and to the reference cells, according to some embodiments of the present invention.

Reference is now made to FIG. 2, which schematically illustrates an exemplary circuit for operating a NVM array 201 according to some embodiments of the present invention. A circuit 200 may include a charge pump or other electric signal source. The circuit 200 may include an external interface to enable decoder 200 to receive and send data from/to external applications.

When attempting to verify the logical state of any of the NVM cells of the array 201, circuit 200 may use its electrical signal source (e.g. charge pump) to produce a word-line signal. According to the prior art, either the same word-line signal is applied to both the word-line of the NVM cells to be operated and to the word-lines of reference cells against which the NVM cells are compared, or a fixedly offset word-line signal is applied to either the word-line of the NVM cells to be operated or to the word-lines of global reference cell(s) against which the NVM cells may be compared. According to some embodiments of the present invention, either or both the array word-line and the reference cell word-line signals are adapted by an offset circuit 203, thereby enabling a dynamic offset by a selected offset value. An offset circuit 203 according to some embodiments of the present invention may either increase or decrease the voltage of the word-line signal provided by the circuit 200. The offset circuit 203 may provide, or apply, its output to either the NVM array 201 word-line, as exemplified in FIG. 6, or to the global reference cell(s) block 504 word-line, as exemplified in FIG. 5. In some embodiment offset table 202 may be adapted to choose to use (such as by using a pointer to point at) a specific reference cells set from a plurality of reference cells sets that were distinctively precharged during their manufacturing, as described and exemplified in FIG. 7 In some embodiments of the present invention, the offset circuit 203 may be integrated, affiliated or embedded or incorporated, into circuit 200, while in other embodiments offset circuit 203 may be a separate circuit from the decoder.

A sense amplifier 205 may receive an output current from both the NVM cell being operated and the output current of global reference cell(s) 204 against which the NVM cell is being compared. The sense amplifier 205 may provide an output to decoder 200 indicating thereby to circuit 200 whether the NVM cell, or the reference cell, is charged to a higher threshold voltage and hence conducts higher current. Based on the output of the sense amplifier 205 as the NVM cell is compared against several reference cells 204, circuit 200 may determine the logical state of the NVM cell being tested.

According to some embodiments of the present invention, an offset table circuit 202, which may include an offset table, may receive a signal from the decoder 200, identifying which NVM cell is being operated. In response to the decoder 200 signal, the offset table circuit 202 may then provide a signal to the offset circuit 203 indicating to offset circuit 203 what amount of word-line signal offset to perform. The segment offset table circuit 202 may be programmed (e.g., offset table compiled) during the manufacturing of the NVM array 201. According to some embodiments of the present invention, the segment offset table circuit 202 may be integrated into the decoder 200, while in other embodiments of the present invention the segment offset table circuit 202 is a separate circuit in communication with the decoder 200. As mentioned hereinbefore, a lowest reference voltage determined for each segment, segment-specific reference voltage levels, and/or offset values between global values and/or local values, which are associated with specific respective logical states of a specific array segment, may be stored in segment offset table 202 (being the "reference voltage table" mentioned hereinbefore) associated with the NVM array 201.

Figure 3:
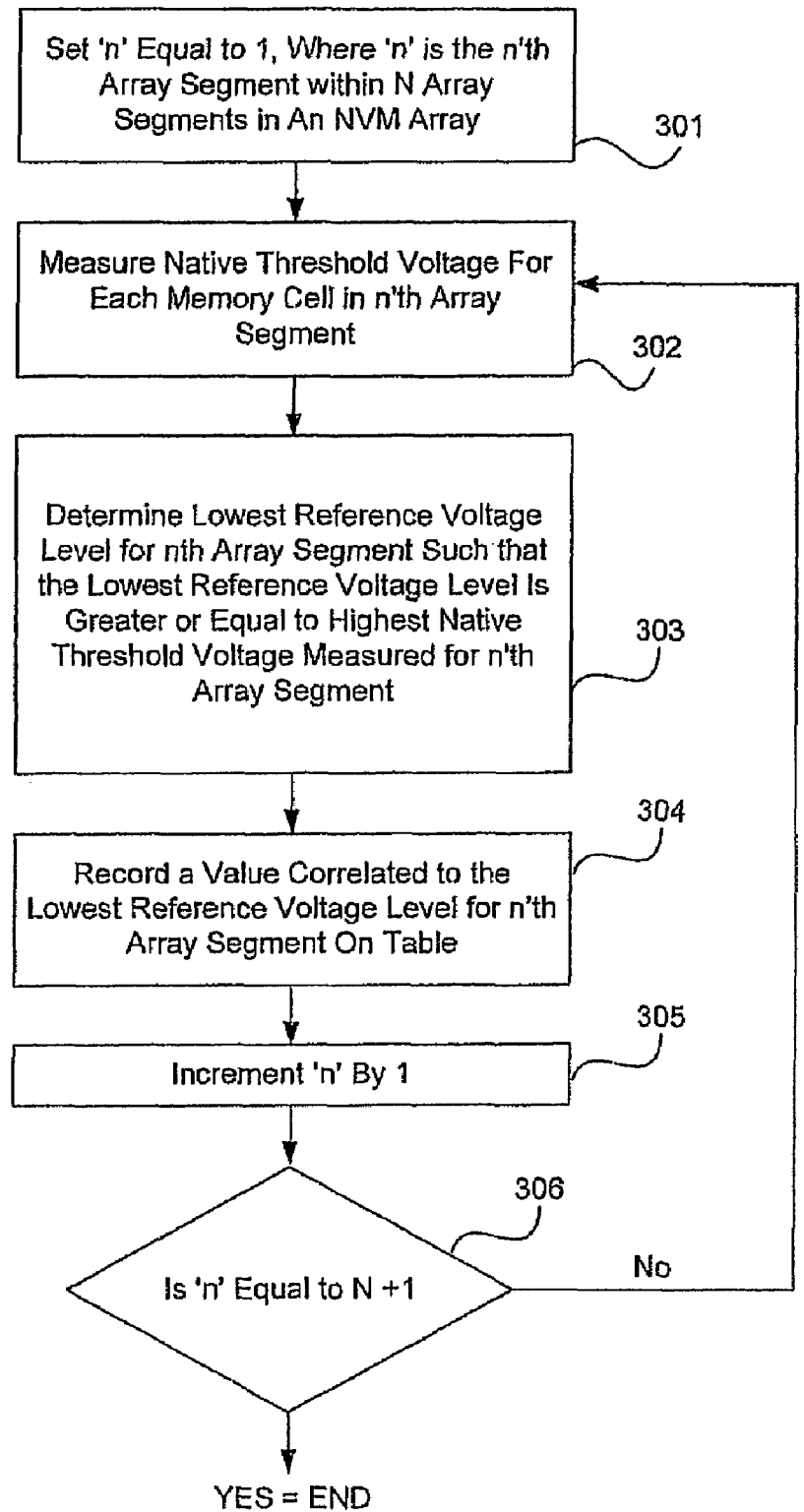
FIG. 3 is a flow chart illustrating a method by which the offset table circuit of FIG. 2 may be compiled for a given NVM array, in accordance with some embodiments of the present invention.

FIG. 3, to which reference is now made, shows a method by which the segment offset table circuit 202 of FIG. 2 may be compiled for a given NVM array 201, in accordance with some embodiments of the present invention. As part of step 301, a variable ('n') may be set to 1, where the constant N is equal to the number of segments in the NVM array 201 to be operated using the segment offset table circuit 202. During step 302, NVM cells in the n'th array segment of the array 201 may be tested or sampled to determine their native threshold voltage. As part of step 302, a lowest reference voltage level for the nth array segment may be determined, such that the lowest reference voltage level is greater or equal or lower to the highest native threshold voltage measured for the n'th array segment. Some value correlated to the lowest reference voltage level for the nth array segment may be stored in an entry or record of the segment offset table circuit 202 associated with n'th array segment (step 303). The (n) variable may be incremented by a value of 1 as part of step 304. During step 305, it may be determined whether (n) is not equal to N+1, and if not, steps 302 through 304 may be repeated.

Although FIG. 3 shows an example of a method by which offset values for NVM cells are determined and stored according to array segment, one of ordinary skill in the art should understand that NVM cells may be grouped in a variety of ways and that offset values associated with these cells may be stored and group accordingly. For example, it is possible to test the entire array 201 and group each cell individually into one of several groups, where each group is associated with a specific offset range from a given reference value. Group one could be associated with an offset of 0.1 to 0.2 Volts, group two with 0.2 to 0.3 Volts, and so on. One or more of the tables containing the groups of cells, for example the above discussed groups of cells defined by a common offset range, may be compiled and folded. Folding is well known in the logic design arts. The folded table or tables may be referenced or used by decoder 200 each time it attempts to operate an NVM cell, as described above. Any method of compiling, organizing, or otherwise using a lookup table, known today or to be devised in the future, is applicable to the present invention.

Figure 4:
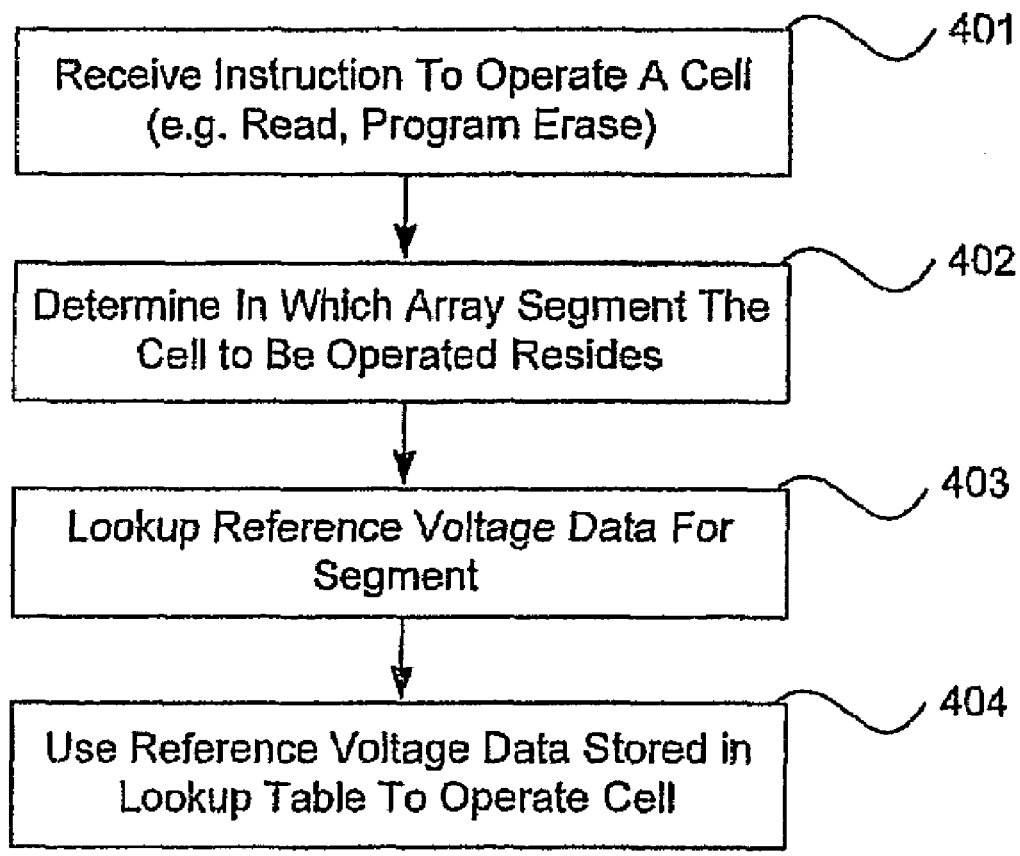
FIG. 4 is a block diagram depicting an example of a table according to some embodiments of the present invention.

Turning now to FIG. 4, there is shown a diagram depicting an exemplary way of operating a reference table, such as segment offset table 202 (FIG. 2) or segment offset table 502 (FIG. 5) according to some embodiments of the present invention. First, an instruction is received to operate a cell in the NVM array 201 (e.g., FIG. 2), at step 401. The instruction may be, "Read", "Program", or "Erase". As discussed hereinbefore, threshold values are applied per segment of the NVM array. Therefore, at step 402, a determination is reached, in which segment the cell to be operated resides. Then, at step 403, a reference voltage data is obtained from the lookup table (e.g., 202, FIG. 2), which pertains to the determined segment. Finally, at step 404, the reference voltage data is utilized to operate the cell.

Figure 5:
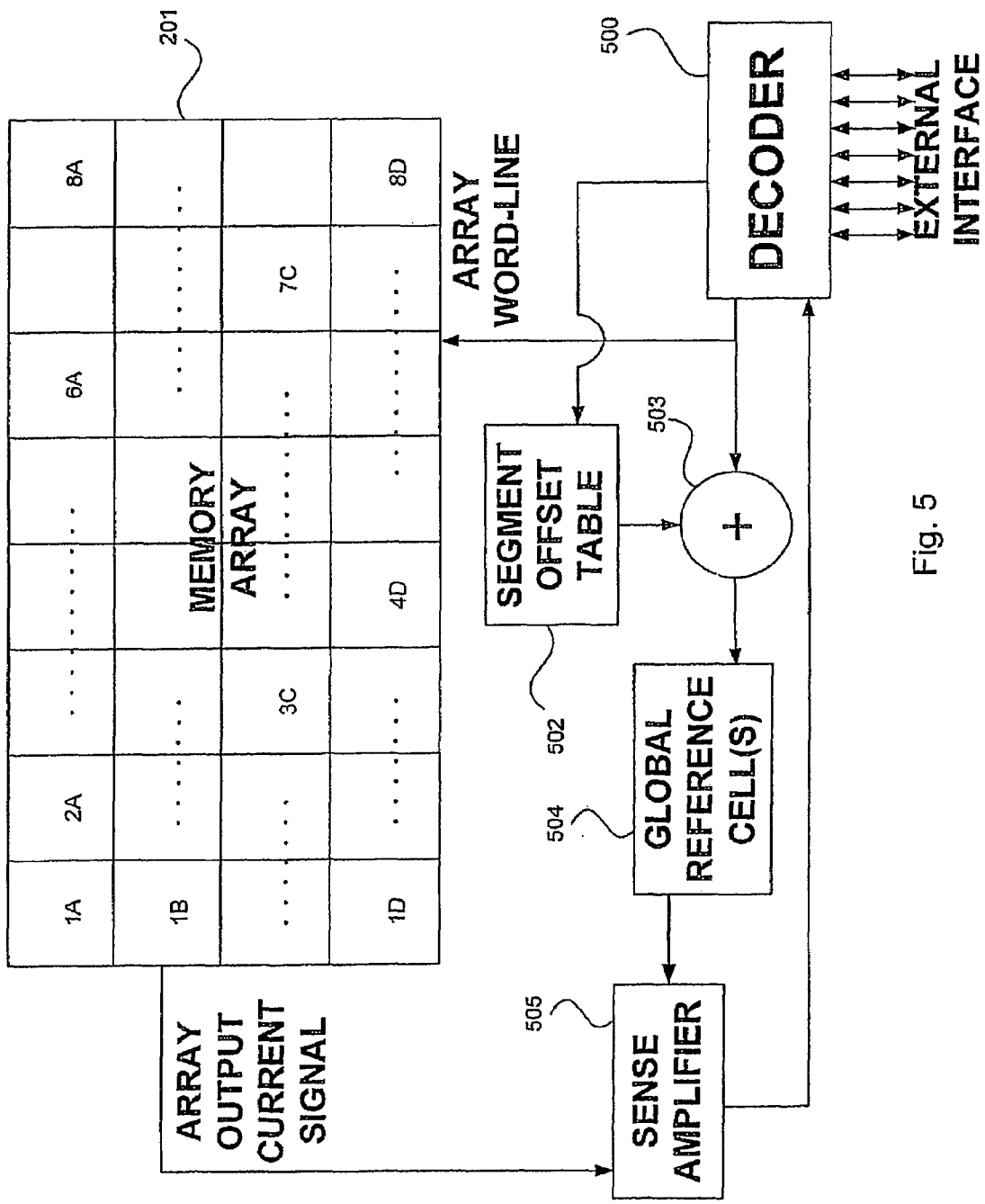
FIG. 5 is a block diagram illustration of another exemplary circuit for operating a NVM array, where an offset voltage/current is applied only to the reference cells, according to some embodiments of the present invention.
Figure 6:
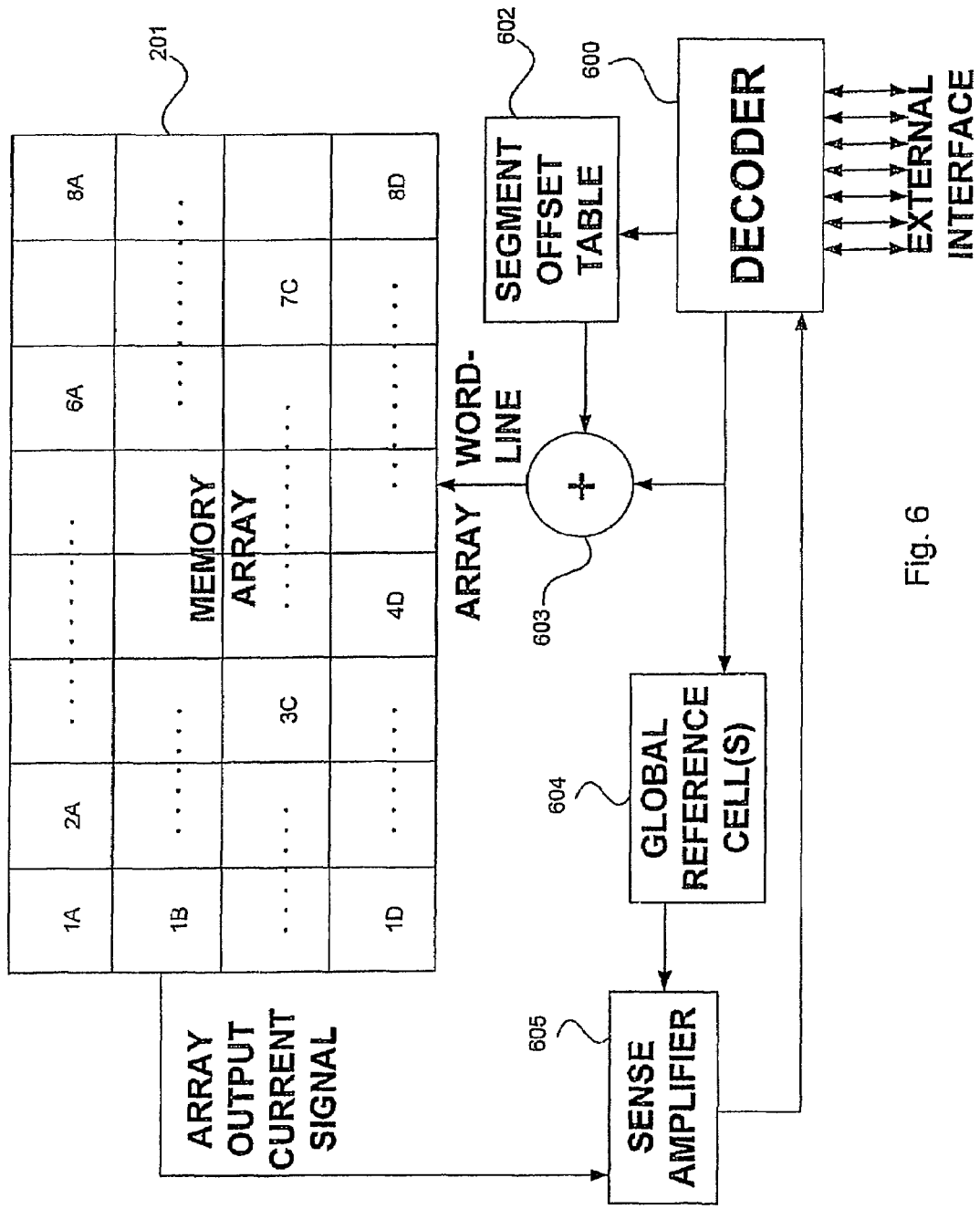
FIG. 6 is a block diagram illustration of another exemplary circuit for operating a NVM array, where an offset voltage/current is applied only to the NVM array, according to some embodiments of the present invention.
Figure 7:
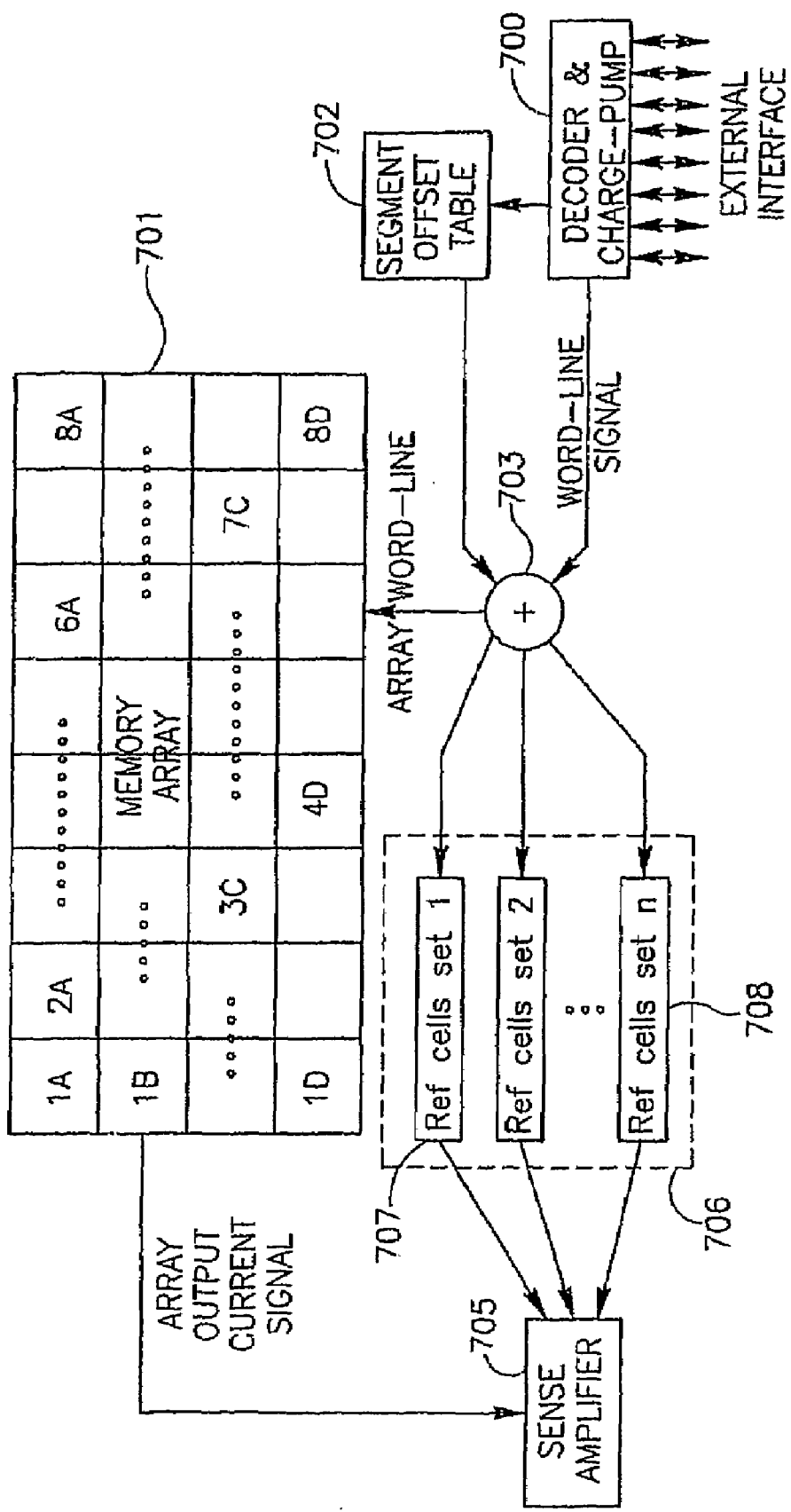
FIG. 7 is a block diagram illustration of another exemplary circuit for operating an NVM array, where an offset voltage/current is applied to the NVM array cells and to one set (out of few possible sets) of reference cells, according to some embodiments of the present invention.

The three exemplary circuits shown in FIGS. 5, 6 and 7 are alternative circuits to the circuit shown in FIG. 2. Referring now to FIG. 5, the offset voltage (or current) is generated and applied only to the global reference cell(s) 504, whereas the voltage (or current) of the cells of interest within NVM array 201, whose state is to be compared against reference cell(s) (504), is independent of the offset voltage (or current). Referring now to FIG. 6, the offset voltage (or current) is generated and applied only to the cells of interest within NVM array 201, whose state is to be compared against reference cell(s) (504), whereas to global reference cell(s) 604 is applied a voltage (or current) that is independent of any offset voltage (or current). Referring again to FIG. 7, the offset value may be obtained by selecting one reference cells set from several reference cells sets that are offsetted with respect to each other by precharging different reference cells sets to different (offsetted) voltage levels during their manufacturing.

Decoders 500, 600 and 700, segment offset tables 502, 602 and 702, offset circuits 503, 603 and 703, sense amplifiers 505, 605 and 705 function substantially in the same manner as decoder 200, segment offset table 202, offset circuit 203 and sense amplifier 205, respectively. Global reference cell(s) 504 and 604 function substantially in the same manner as, global reference cell(s) 204.

According to some embodiments of the present invention, global reference cells 706 may include multiple (n) sets of reference cells, designated 707 ("Ref cells set 1") to 708 ("Ref cells set n"). The n sets of reference cells may be devised based on different criterions, as described hereafter.

According to some aspects of this embodiment, the n sets of reference cells may be devised as "segment-oriented", which means that each set of the n sets of reference cells may be associated with, or dedicated to, a different segment of memory array 701. Namely, each specific set of the n sets of reference cells may provide the various voltage levels (program verify voltage level, read verify voltage level, etc.) required for operating each cell within the segment associated with the specific set. For example, reference cells constituting reference cells set 1 (707) may each relate to a different logical state (e.g., program verify voltage level, read verify voltage level, etc.) of a segment consisting of cells "1A" to "8A" in memory array 701). Reference cells constituting cells set n (708), on the other hand, may each relate to a different logical state (e.g., program verify voltage level for a given segment, read verify voltage level for a given segment, etc.) of a segment consisting of cells "1D" to "8D" in memory array 701. Put otherwise, if there are n segments and n reference cells sets, then reference cells set 1 (707) may provide signals "Read/Seg1", "Program/Seg1", etc. Likewise, reference cells set 2 may provide signals "Read/Seg2", "Program/Seg2", etc. Likewise, reference cells set 3 may provide signals "Read/Seg3", "Program/Seg3", and so on.

According to some other aspects of this embodiment, the n sets of reference cells may be "state-oriented", which means that each one of the n sets 707 to 708 may be associated with, or dedicated to, a different logical state of the array cells. For example, reference cells constituting cells set 1 (707) may be associated with a program verify voltage level, whereas reference cells constituting cells set n (708) may be associated, for example, with a read verify voltage level.

The reference cells constituting reference set 1 (707) may each be associated with a different segment. For example, if reference cells set 1 (707) is associated with a read verification voltage level, then a first reference cell within set 1 (707) may be associated with the read verification voltage level of a first segment of array 701 ("Read 1/Segment 1"), a second reference cell within set 1 (707) may be associated with the read verification voltage level of a second segment of array 701 ("Read 1/Segment 2"), and so on.

Likewise, if reference cells set n (708) is associated with a program verification voltage level, then a first reference cell within set n (708) may be associated with the program verification voltage level of a first segment of array 701 ("Program n/Segment 1"), a second reference cell within set n (708) may be associated with the program verification voltage level of a second segment of array 701 ("Program n/Segment 2"), and so on.

While a number of exemplary aspects and embodiments have been discussed above, those of skill in the art will recognize certain modifications, permutations, additions and sub-combinations thereof. It is therefore intended that the following appended claims, and claims hereafter introduced, be construed as including all such modifications, permutations, additions and sub-combinations as are within their true spirit and scope.

What is claimed:

1. A non-volatile memory device comprising:
   at least two memory array segments, and
   a controller including control logic adapted to determine a threshold offset value for a given memory array segments by accessing a table of offset values.

2. The device according to claim 1, wherein said controller further includes control logic adapted to adjust an offset associated with a sensing circuit based on the determined threshold offset value.

3. The device according to claim 2, wherein said controller further includes control logic adapted to operate one or more cells within the given memory array segment using sensing circuit having an adjusted offset.

4. The device according to claim 1, wherein said controller further includes control logic adapted to selected one or more reference cells from a set of reference cells based on the determined threshold value.

5. The device according to claim 4, wherein said controller further includes control logic adapted to operate one or more cells within the given memory array segment using selected reference cells.

6. The device according to claim 1, wherein said controller further includes control logic adapted to measure an offset value for each of a set of memory array segments.

7. The device according to claim 6, wherein said controller further includes control logic adapted to programming the offset table with the measured offset values.

8. A memory array circuit comprising: an offset table having at least two offset values, wherein each offset value is associated with at least one memory segment in said memory array circuit; and
an adjustable reference cell circuit comprising one or more global reference cells, each having a substantially fixed threshold, and an offset circuit adapted to adjust an output of the one or more reference cells.

9. The memory array circuit according to claim 8, further comprising a controller, wherein said controller is adapted to access said offset table and to send a signal to said offset circuit correlated to an offset value associated with a memory cell to be operated.

10. The memory array circuit according to claim 9, wherein the global reference cells comprise multiple sets of reference cells.

11. The memory array circuit according to claim 10, wherein each set of the multiple sets of reference cells is used for operating a different memory array segment.

12. The memory array circuit according to claim 10, wherein each set of the multiple sets of reference cells is used for operating a different state of memory array segments.

13. A controller for operating a memory cell in a memory array, said controller adapted to associated one or more values in threshold offset value table with said memory cell based on a location of said memory cell and based on the operation to be performed on said cell.

14. The controller according to claim 13 further adapted to adjusted an offset circuit of a global reference cells by the associated threshold offset value.

15. The controller according to claim 14 further adapted to operate said memory cell using the global reference cell whose input offset circuit has been adjusted.

16. The controller according to claim 13, further adapted to select a global reference cell based on the associated threshold offset value.

* * * * *